United States Patent [19]

Burger

[11] Patent Number: 5,441,906
[45] Date of Patent: Aug. 15, 1995

[54] INSULATED GATE FIELD EFFECT TRANSISTOR HAVING A PARTIAL CHANNEL AND METHOD FOR FABRICATING

[75] Inventor: Vida I. Burger, Phoenix, Ariz.

[73] Assignee: Motorola, Inc., Schaumburg, Ill.

[21] Appl. No.: 223,398

[22] Filed: Apr. 4, 1994

[51] Int. Cl.6 .......................................... H01L 21/265
[52] U.S. Cl. ...................................... 437/41; 437/44; 437/45; 437/57
[58] Field of Search .................. 437/44, 45, 57, 41

[56] References Cited

U.S. PATENT DOCUMENTS

| | | |
|---|---|---|
| 4,062,699 | 12/1977 | Armstrong ............................ 437/41 |
| 4,898,835 | 2/1990 | Cawlfield . |
| 4,949,136 | 8/1990 | Jain . |
| 4,968,639 | 11/1990 | Bergonzoni ............................ 437/57 |
| 5,147,811 | 9/1992 | Sakagami . |
| 5,162,884 | 11/1992 | Liou et al. . |
| 5,166,087 | 11/1992 | Kakimoto . |
| 5,171,700 | 12/1992 | Zamanian . |
| 5,182,619 | 1/1993 | Pfiester . |
| 5,202,276 | 4/1993 | Malhi . |
| 5,248,627 | 9/1993 | Williams . |
| 5,258,635 | 11/1993 | Nitayama et al. . |
| 5,270,235 | 12/1993 | Ito . |

OTHER PUBLICATIONS

C. F. Codella et al., "Submicron IGFET Device with Double Implanted Lightly Doped Drain/Source Structure", IBM Technical Disclosure Bulletin, vol. 26, No. 12, May 1984, pp. 6584–6586.

H. Yoshimura et al., "New CMOS Shallow Junction Well FET Structure (CMOS-SJET) for Low Power-Supply Voltage", IEEE, 1992, pp. 909–912.

Primary Examiner—Tom Thomns
Assistant Examiner—Trung Dang
Attorney, Agent, or Firm—Rennie William Dover

[57] ABSTRACT

A complementary insulated gate field effect transistor (10) having a partial channel. A gate electrode structure (29, 31) is formed on a dopant well (13, 14). An implant block mask (33, 38) is formed on a portion of the gate structure. An impurity material is implanted into the dopant well to form a dopant region (34, 39) having a first portion (36, 42) and a second portion (37, 41). The implant is of sufficient energy that a portion of the impurity material penetrates a portion gate electrode structure (29, 31) to form the second portion (37, 41) which serves as the partial channel. The partial channel provides the complementary insulated gate field effect transistor (10) with a low subthreshold swing, and improved saturation current and source/drain parasitic capacitance.

11 Claims, 4 Drawing Sheets

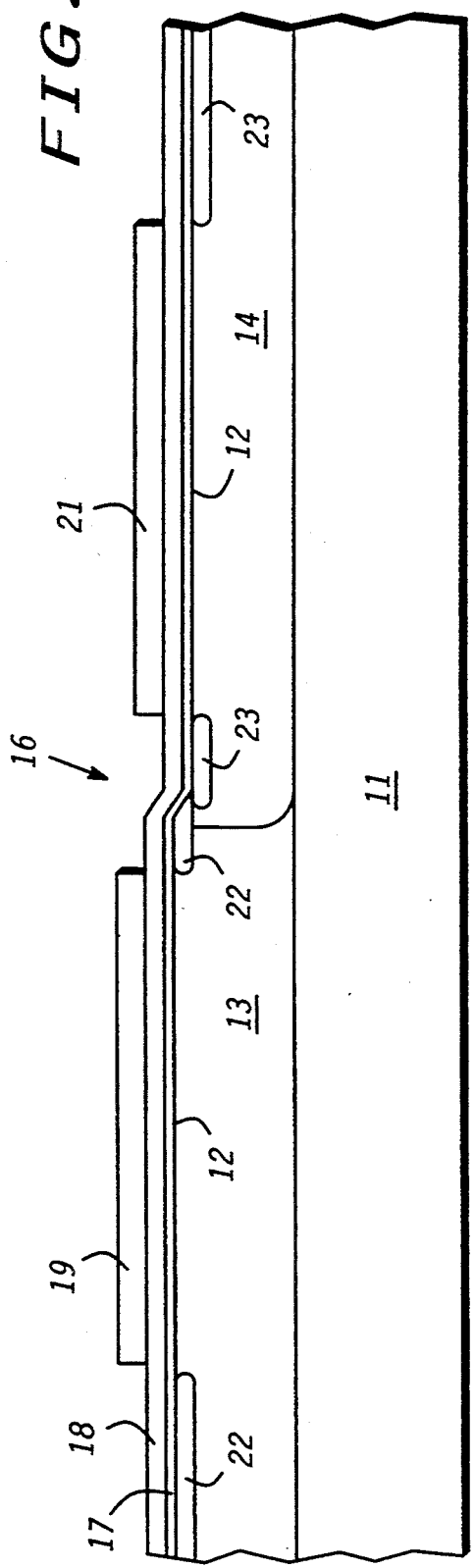
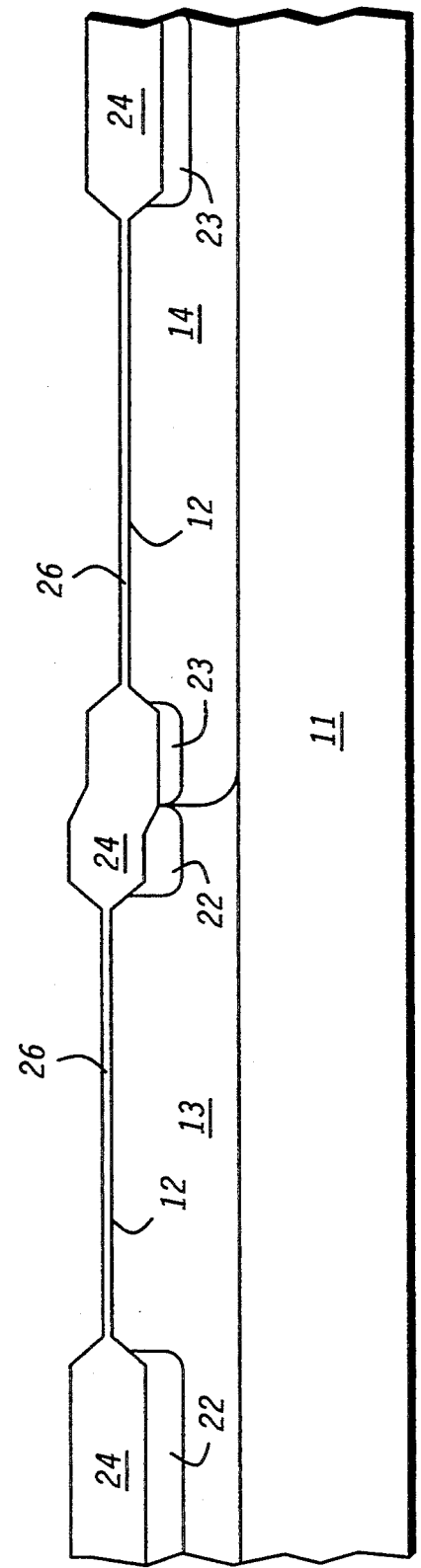

INSULATED GATE FIELD EFFECT TRANSISTOR HAVING A PARTIAL CHANNEL AND METHOD FOR FABRICATING

CROSS-REFERENCE TO RELATED APPLICATIONS

The present application is related to copending U.S. patent application Ser. No. 08/223,393, Attorney's Docket No. SC08727P, entitled "INSULATED GATE FIELD EFFECT TRANSISTOR HAVING A SUBTHRESHOLD SWING AND METHOD FOR FABRICATING," filed on Apr. 4, 1994, by Vida Ilderem Burger et al. and assigned to the same assignee, Motorola, Inc.

The present application is further related to copending U.S. patent application Ser. No. 08/223,394, Attorney's Docket No. SC08870P, entitled "INSULATED GATE FIELD EFFECT TRANSISTOR AND METHOD FOR FABRICATING", filed Apr. 4, 1994, by Michael H. Kaneshiro et al. and assigned to the same assignee, Motorola, Inc.

FIELD OF THE INVENTION

The present invention relates, in general, to insulated gate field effect transistors, and more particularly, to insulated gate field effect transistors having partial channels.

BACKGROUND OF THE INVENTION

Insulated gate field effect transistors are becoming increasingly important in low voltage and low power applications such as portable communications and portable computers, i.e., pagers, cellular phones, digital logic, memories, etc. Since low power consumption is a primary goal in these applications, these types of transistors are typically designed to operate at supply voltages of less than 3.5 volts. However, their subthreshold characteristics limit the minimum supply voltages at which these transistors are capable of reliably operating. More particularly, when the gate-to-source voltage is below the threshold voltage, the channel current decreases approximately exponentially with a decreasing gate voltage rather than becoming zero. Thus, current flows (hence power is consumed) even when the gate-to-source voltage is less than the threshold voltage.

A parameter commonly used to characterize the performance of insulated gate field effect transistors in the subthreshold region is the subthreshold swing. The subthreshold swing refers to the change in the gate-to-source voltage required to change the drain current by an order of magnitude. Insulated gate field effect transistors having high subthreshold swing values have large leakage currents and consume relatively large amounts of standby power. Insulated gate field effect transistors having low subthreshold swing values, on the other hand, have low leakage currents, consume less power, and are more ideally suited for low power applications.

Accordingly, it would be advantageous to have a method for fabricating insulated gate field effect transistors that reduces the subthreshold swing of the transistors and increases their peak transconductance and saturation current. It would be of further advantage for the method to be easily integrated into insulated gate field effect transistor process flows.

BRIEF DESCRIPTION OF THE DRAWINGS

FIGS. 1-7 illustrate enlarged cross-sectional views of a portion of an insulated gate field effect transistor during fabrication in accordance with an embodiment of the present invention.

DETAILED DESCRIPTION OF THE DRAWINGS

Figure 3:
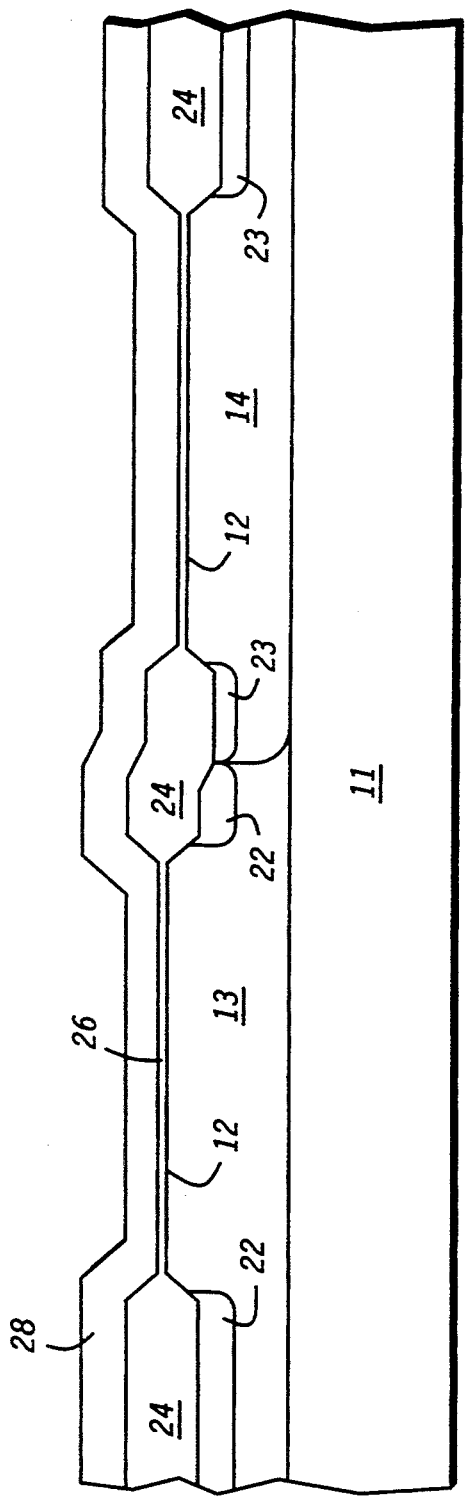

Generally, the present invention provides a semiconductor device such as an insulated gate field effect transistor and a method of fabricating or forming the transistor. More particularly, the method allows fabrication of an insulated gate field effect transistor having a channel region that is partially doped. This region is referred to as a partial channel and results in low subthreshold swings and higher saturation currents. Insulated gate field effect transistors having partial channels have an increased peak transconductance and saturation current compared to transistors having a full channel since the charge carriers in the partial channel have a high mobility. In addition, the partial channel lowers the source/drain capacitance. As those skilled in the art are aware, the channel is defined as the area in the semiconductor substrate between the source and drain regions that is under a gate structure and that is doped after the formation of the field oxide regions. The formation of the partial channel is accomplished by forming a thick gate structure and forming the partial channel in a portion of the semiconductor substrate covered by the thick gate structure.

FIG. 1 illustrates an enlarged cross-sectional view of a portion of a partially completed low power insulated gate field effect transistor during processing in accordance with an embodiment of the present invention. What is shown in FIG. 1 is a semiconductor substrate 11 of P-conductivity type having a major surface 12. An impurity well 13 of P−-conductivity type, commonly referred to as a P-well, extends into semiconductor substrate 11 from a first portion of major surface 12 and an impurity well 14 of N−-conductivity type extends into substrate 11 from a second portion of major surface 12. P-well 13 laterally abuts N-well. 14. Further, a step 16 or bird's beak is formed after the formation of N-well 14 and before the formation of P-well 13. Methods of forming wells 13 and 14 are commonly referred to as twin well processes and typically result in the formation of bird's beaks 16. Twin well processes and bird's beak formation are well known to those skilled in the art. By way of example, substrate 11 has a resistivity between approximately 6 ohm-centimeter ($\Omega$-cm) and approximately 8 $\Omega$-cm, and wells 13 and 14 have a surface concentration on the order of $1 \times 10^{16}$ atoms per cubic centimeter (atoms/cm$^3$).

Using techniques well known to those skilled in the art, a layer of oxide 17 is formed on major surface 12, a layer of polysilicon 18 is formed on oxide layer 17, and a layer of nitride (not shown) is formed on layer of polysilicon 18. The layer of nitride is patterned to form islands over active areas or regions in which transistors are to be fabricated. Although the layer of nitride is not shown, a first portion 19 of the nitride layer serves as one island and a second portion 21 serves as another island. Additionally, layer of oxide 17, layer of polysilicon 18, and the layer of nitride form implant block masks over portions of wells 13 and 14. More particularly, first portion 19 serves as an implant block mask over a portion of P-well 13 and second portion 21 serves as an implant block mask over a portion of N-well 14.

An additional implant block mask (not shown) of, for example, photoresist is formed over N-well 14. An impurity material of P conductivity type is implanted into portions of P-well 13 not protected by the implant block mask to form dopant regions 22. This implant block mask is removed and another implant block mask (not shown) of, for example, photoresist is formed over P-well 13 and dopant regions 22. An impurity material of N conductivity type is implanted into portions of N-well 14 not protected by the additional implant block mask to form dopant regions 23. Dopant regions 22 and 23 prevent inversion under field oxide regions 24 (shown in FIG. 2) and provide isolation punch through protection.

FIG. 2 illustrates an enlarged cross-sectional view of the portion of the partially completed low power insulated gate field effect transistor of FIG. 1 further along in processing. It shall be understood that the same reference numerals are used in the figures to denote the same elements. It shall be further understood that the concentrations and thicknesses provided in the description of the present invention merely serve as exemplary values and are not limitations of the present invention. An anneal is performed that forms field oxide regions 24 and drives in the impurity material of dopant regions 22 and 23, thereby enlarging dopant regions 22 and 23. Methods of forming dopant regions 22 and 23 are well known to those skilled in the art.

Portions 19 and 21 of the nitride layer, polysilicon layer 18 and oxide layer 17 are removed using techniques well known to those skilled in the art. A layer of sacrificial oxide (not shown) is grown on major surface 12 and on field oxide regions 24. By way of example, the sacrificial oxide layer has a thickness of approximately 400 angstroms. The sacrificial oxide layer serves to oxidize any silicon nitride film formed during field oxidation (Kooi effect) around the active region edges. The sacrificial oxide layer is removed and a layer of gate oxide 26 is formed on major surface 12 and on field oxide regions 24. By way of example, gate oxide layer 26 has a thickness of approximately 105 angstroms.

Now referring to FIG. 3, a layer of polysilicon 28 is formed on gate oxide layer 26. By way of example, polysilicon layer 28 has a thickness of approximately 3,000 angstroms. Polysilicon layer 28 serves as a gate conductor layer. Methods for forming gate oxide layers such as gate oxide layer 26 and polysilicon layers such as polysilicon layer 28 are well known to those skilled in the art. In addition, the techniques used in preparation for the formation of gate oxide layer 26 and polysilicon layer 28, i.e., formation of a sacrificial oxide layer is also known in the semiconductor processing art.

Figure 4:
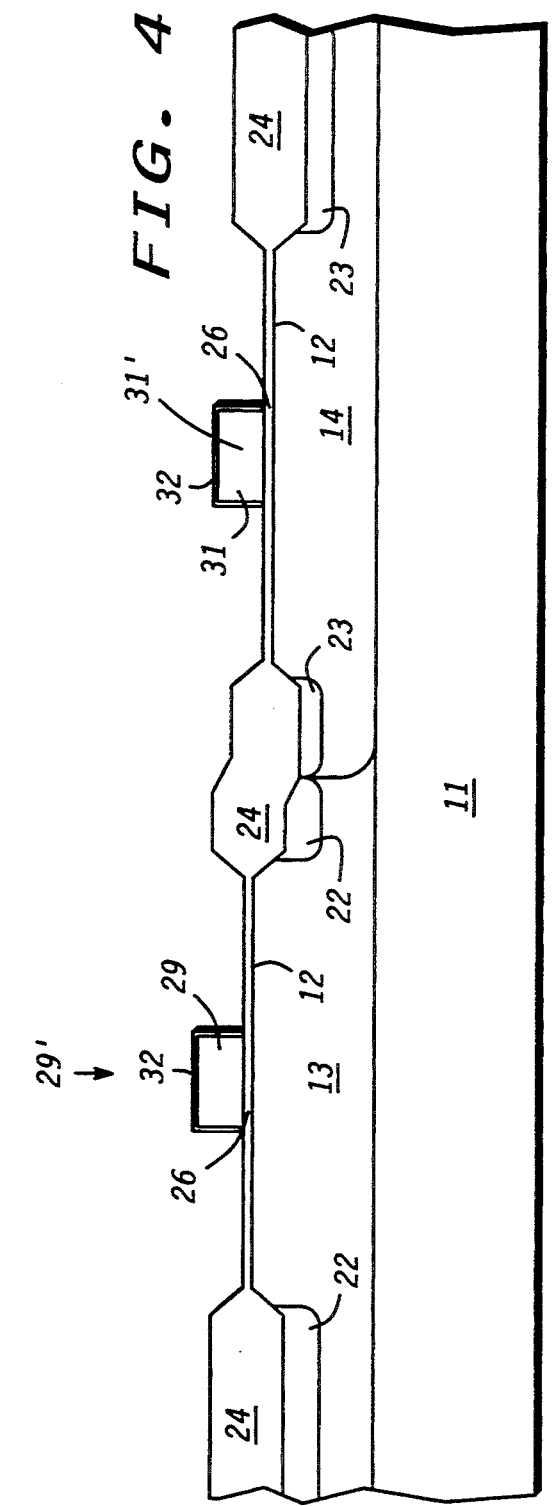

FIG. 4 illustrates an enlarged cross-sectional view of the portion of the partially completed low power insulated gate field effect transistor of FIG. 3 further along in processing. Layer of polysilicon 28 is patterned to form polysilicon gate electrodes 29 and 31 over P-well 13 and N-well 14, respectively. Gate electrodes 29 and 31 in conjunction with the portions of gate oxide layer 26 between major surface 12 and gate electrodes 29 and 31 form gate structures 29' and 31', respectively. An oxide layer 32 is formed on polysilicon gate electrodes 29 and 31. As those skilled in the art are aware, oxide layer 32 serves to re-grow the portions of gate oxide layer 26 that have been undercut.

Figure 5:
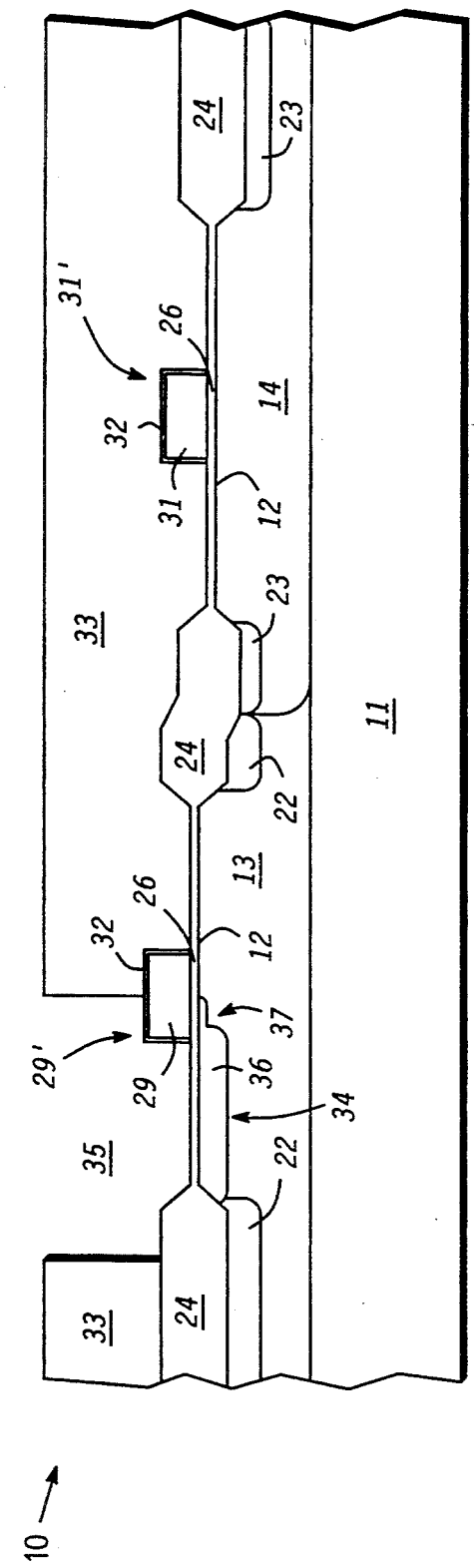

FIG. 5 illustrates an enlarged cross-sectional view of the portion of a partially completed complementary low power insulated gate field effect transistor 10. An implant block mask 33 of, for example, photoresist is formed on layer of oxide 32. Photoresist 33 is patterned to form a window 35 which exposes layer of oxide 32 over a portion of polysilicon gate electrode 29 and a portion of oxide layer 32 covering P-well 13. The exposed portion of oxide layer 32 covering P-well 13 is adjacent one side of polysilicon gate electrode 29.

An impurity material of P conductivity type such as, for example, boron is implanted into a portion of P well 13 to form a dopant region 34. Dopant region 34 has a first portion 36 and a second portion 37. An implant energy for implanting the boron is selected such that the impurity material penetrates polysilicon gate electrode 29 and extends into P-well 13 to form second portion 37. Since the impurity material of second portion 37 must traverse or travel through the gate electrode 29, second portion 37 is shallower than first portion 36. By way of example, a zero degree implant having an energy of approximately 100 Kilo-electron Volts (KeV) and a dose on the order of $1 \times 10^{12}$ atoms/cm$^2$ results in a first region 36 having a surface concentration on the order of $1 \times 10^{16}$ atoms/cm$^3$ for polysilicon gate electrode 29 having a thickness of approximately 3,000 angstroms. For these implant conditions, first portion 36 extends approximately 0.5 micron ($\mu$m) into P-well 13 from major surface 12 and second portion 37 has a surface concentration on the order of $1 \times 10^{17}$ atoms/cm$^3$ and extends approximately 0.2 $\mu$m into P-well 13 from major surface 12.

Optionally, a second zero degree boron implant is performed which does not penetrate gate electrode 29. Thus, the impurity material of the second zero degree implant does not enter second portion 37. However, this implant further dopes first portion 36 to provide punch-through protection. By way of example, the second implant has an energy of about 20 KeV, a dose on the order of $5 \times 10^{13}$ atoms/cm$^2$ and results in a surface concentration ranging between approximately $1 \times 10^{18}$ atoms/cm$^3$ and approximately $3 \times 10^{18}$ atoms/cm$^3$. These implant conditions result in a final junction depth of first portion 36 of approximately 0.6 $\mu$m. The optional second implant provides additional punch-through protection.

Figure 6:
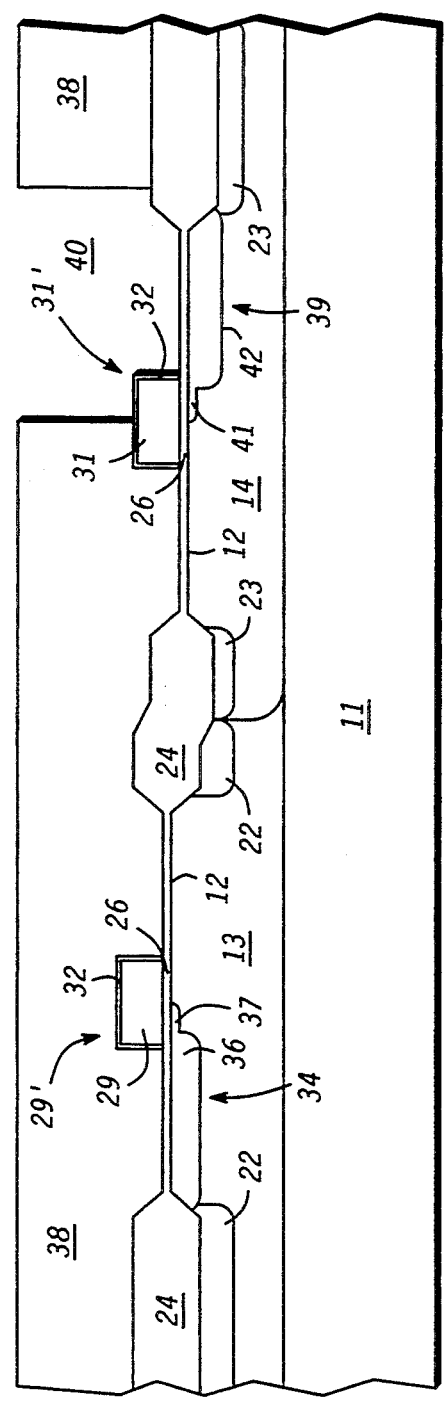

Referring now to FIG. 6, implant block mask 33 is removed and another implant block mask 38 of, for example, photoresist is formed on layer of oxide 32. Photoresist 38 is patterned to form a window 40 which exposes layer of oxide 32 over a portion of polysilicon gate electrode 31 and a portion of oxide layer 32 covering N-well 14.

An impurity material of N conductivity type such as, for example, phosphorus is implanted into a portion of N-well 14 to form a dopant region 39. Dopant region 39 has a first portion 42 and a second portion 41. An implant energy for implanting the phosphorus is selected such that the impurity material penetrates polysilicon gate electrode 31 and extends into N-well 14 to form second portion 41. Since the impurity material of second portion 41 must traverse or travel through the gate electrode 31, second portion 41 is shallower than first portion 42. By way of example, a zero degree implant having an energy of approximately 200 KeV and a dose on the order of $1 \times 10^{12}$ atoms/cm$^2$ results in a first portion 42 having a surface concentration on the order of $1 \times 10^{16}$ atoms/cm$^3$ for polysilicon gate electrode 31 having a thickness of approximately 3,000 angstroms. For these implant conditions, first portion 42 extends approximately 0.5 μm into N-well 14 from major surface 12 and second portion 41 has a surface concentration on the order of $1 \times 10^{17}$ atoms/cm$^3$ and extends approximately 0.2 μm into N-well 14 from major surface 12.

Optionally, a second zero degree phosphorus implant is performed which does not penetrate gate electrode 31. Thus, the impurity material of the second zero degree implant does not enter second portion 41. However, this implant further dopes first portion 42 to provide punchthrough protection. By way of example, the second implant has an energy of about 45 KeV, a dose on the order of $2 \times 10^{13}$ atoms/cm$^2$ and results in a surface concentration ranging between approximately $1 \times 10^{18}$ atoms/cm$^3$ and approximately $3 \times 10^{18}$ atoms/cm$^3$. These implant conditions result in a final junction depth of first portion 42 of approximately 0.6 μm. The optional second implant provides additional punchthrough protection. Implant block mask 38 is removed. Techniques for forming and removing implant block masks such as masks 33 and 38 are well known to those skilled in the art.

Figure 7:
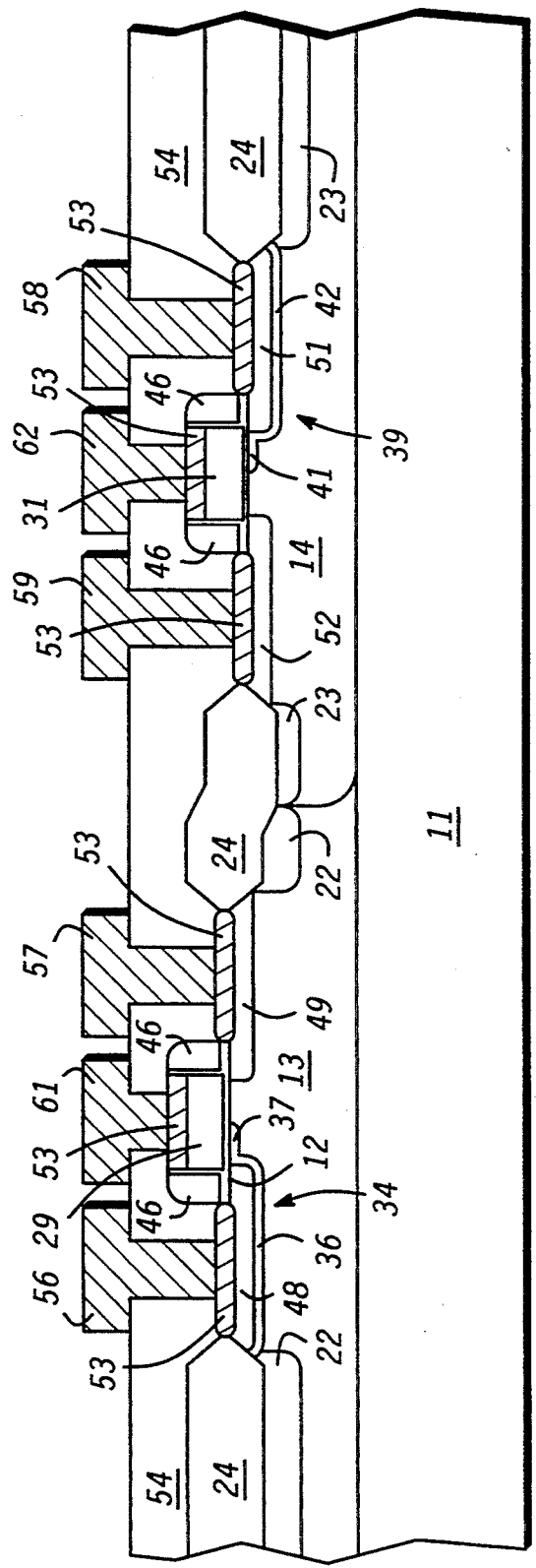

FIG. 7 illustrates an enlarged cross-sectional view of the portion of the complementary low power insulated gate field effect transistor 10 of FIG. 6 further along in processing. Source and drain regions 48 and 49, respectively, are formed in P-well 13 adjacent polysilicon gate electrode 29. Source and drain regions 48 and 49, respectively, are of N conductivity type and formed using, for example by a zero degree arsenic implant. Simultaneously with the formation of source and drain regions 48 and 49, respectively, polysilicon gate electrode 29 is doped to be of N conductivity type, e.g., doped with arsenic.

Further, source and drain regions 51 and 52, respectively, are formed in N-well 14 adjacent polysilicon gate electrode 31. Source and drain regions 51 and 52, respectively, are of P conductivity type and formed using, for example, a zero degree boron implant. Simultaneously with the formation of source and drain regions 51 and 52, respectively, polysilicon gate electrode 31 is doped to be of P conductivity type, e.g., doped with boron. In accordance with the earlier described embodiment for source and drain regions 48 and 49, respectively, source region 51 is within dopant region 39. By way of example, regions 48, 49, 51, and 52 extend between approximately 0.2 μm and approximately 0.3 μm into their respective wells 13 and 14 from major surface 12. Preferably, at the intersection of the regions 48 and 51 with 34 and 39, respectively, the dopant concentration ranges between approximately $5 \times 10^{16}$ atoms/cm$^3$ and $1 \times 10^{18}$ atoms/cm$^3$.

Although it is preferable that source regions 48 and 51 be contained within dopant regions 34 and 39, respectively, it shall be understood that alternatively drain regions 49 and 52 are contained within dopant regions 34 and 39, respectively, or a source region is contained within a dopant region and a drain region is contained within another dopant region. Methods of forming source and drain regions such as regions 48, 49, 51, and 52 are well known to those skilled in the art. An oxide layer (not shown) is formed on oxide layer 32. The oxide layer has a thickness on the order of 300 angstroms and may be formed by well known processes such as a tetraethylorthosilicate (TEOS) deposition process. Using techniques well known in the art, dielectric spacers 46 are formed along oxide layer 32 lining the sidewalls of polysilicon gate electrodes 29 and 31. By way of example, spacers 46 are nitride spacers. It shall be understood that dielectric spacers 46 are optional.

Still referring to FIG. 7 and using techniques well known to those skilled in the art, electrodes are formed which contact regions 48, 49, 51, and 52, as well as gate electrodes 29 and 31. For example, a silicide 53 may be formed in source regions 48 and 51, drain regions 49 and 52 and in polysilicon gate electrodes 29 and 31. An insulating layer 54 is formed on device 10, i.e., on field oxide regions 24, source regions 48 and 51, drain regions 49 and 52, and polysilicon gate electrodes 29 and 31. A plurality of openings (not shown) are formed in insulating layer 54 to expose portions of silicide 53 in source regions 48 and 51, drain regions 49 and 52, and polysilicon gate electrodes 29 and 31. Source and drain electrodes 56 and 57 are formed to contact the silicide 53 in the respective source and drain regions 48 and 49. Source and drain electrodes 58 and 59 are formed to contact the silicide 53 in the respective source and drain regions 51 and 52, Gate electrodes 61 and 62 are formed to contact the silicide on polysilicon gate electrodes 29 and 31, respectively. Methods of forming electrodes to silicided regions are well known to those skilled in the art.

Thus, the present invention comprises a method for fabricating complementary insulated gate semiconductor device 10 having source regions 48 and 51, drain regions 49 and 52, and gate electrodes 29 and 31. Although a complementary low power insulated gate semiconductor device 10 having a partial channel has been described, it shall be understood that individual N-channel and P-channel insulated gate semiconductor devices having partial channels may also be fabricated in accordance with the present invention.

By now it should be appreciated that a method of forming insulated gate semiconductor devices having a partial channel has been provided. The partial channel is formed by masking a high energy implant through part of the gate electrode. Since these devices have less dopants in the non-implanted channel region, the dopant has a high mobility resulting in high peak transconductance and saturation current. In addition, both these devices have a low body effect, due to the light doping of the-wells used in the process, as well as high saturation currents. The low body effect allows for stacking of devices. Further, these devices have subthreshold swings in the range of 70–80 mV/decade of drain current. These low subthreshold swings permit lowering of the threshold voltage without compromising the leakage current, which is highly desirable for low power and low voltage applications.

I claim:

1. A method for fabricating an insulated gate field effect transistor having a partial channel, comprising the steps of:
    providing a semiconductor substrate of a first conductivity type having a major surface;
    forming a gate structure on a portion of the major surface;
    forming, after the step of forming a gate structure on a portion of the major surface, a first dopant region of the first conductivity type in the semiconductor substrate, the first dopant region having first and second portions, the first portion of the first dopant region extending into a portion of the semiconductor substrate on a first side of the gate structure and the second portion of the first dopant region extending into a portion of the semiconductor substrate covered by the gate structure, wherein the first portion is contiguous with the second portion and extends further into the semiconductor substrate than the second portion and the second portion serves as the partial channel;

forming second and third dopant regions of a second conductivity type in the semiconductor substrate, the second dopant region extending into the first portion of the first dopant region and the third dopant region extending into a portion of the semiconductor substrate on a second side of the gate structure, wherein the third dopant region is spaced apart from the second portion of the first dopant region;

forming a first electrode in contact with the second dopant region;

forming a second electrode in contact with the third dopant region; and forming a third electrode in contact with the gate structure.

2. The method of claim 1, wherein the steps of forming the second and third dopant regions include self-aligning the second and third dopant regions with the first and second sides, respectively, of the gate structure.

3. The method of claim 1, wherein the step of forming a first dopant region further comprises the steps of:

covering a portion of the gate structure and the portion of the semiconductor substrate on the second side of the gate structure with an implant block mask; and implanting an impurity material of the first conductivity type into the portion of the semiconductor substrate on the first side of the gate structure to form the first portion of the first dopant region and through an uncovered portion of the gate structure into the semiconductor substrate to form the second portion of the first dopant region.

4. The method of claim 3, further including performing another implant of the impurity material of the first conductivity type into the first portion of the first dopant region.

5. The method of claim 1, further including forming the first dopant region to have a greater dopant concentration than the semiconductor substrate.

6. A method for fabricating an insulated gate field effect transistor, the method including a step for setting a subthreshold swing of the insulated gate field effect transistor, comprising the steps of:

providing a semiconductor substrate of a first conductivity type having a major surface;

forming a first gate structure on a first portion of a first region of the semiconductor substrate;

doping a sub-portion of the first portion of the first region and a second portion of the first region with an impurity material of the first conductivity type, the second portion of the first region on a first side of the first gate structure and contiguous with the sub-portion of the first portion;

doping a sub-portion of the second portion of the first region with an impurity material of a second conductivity type;

doping a third portion of the first region with the impurity material of the second conductivity type, the third portion on the second side of the first gate structure and spaced apart from the sub-portion of the first portion of the first region;

forming a first electrode to the sub-portion of the second portion of the first region and a second electrode to the third portion; and forming a third electrode to the first gate structure.

7. The method of claim 6, further including, after the step of doping a sub-portion of the first portion of the first region and a second portion of the first region, doping the second portion of the first region a second time with the impurity material of the first conductivity type, wherein the impurity material from doping the second portion of the first region a second time is substantially absent from the sub-portion of the first portion of the first region.

8. The method of claim 6, wherein the step of providing a semiconductor substrate includes providing the semiconductor substrate having a dopant well of a second conductivity type extending into the semiconductor substrate, wherein the dopant well is adjacent to the first region, and further comprising the steps of:

forming a second gate structure on a first portion of the dopant well;

doping a sub-portion of the first portion of the dopant well and a second portion of the dopant well with an impurity material of the second conductivity type, the second portion on a first side of the second gate electrode and contiguous with the sub-portion of the first portion of the dopant well;

doping a sub-portion of the second portion of the dopant well with an impurity material of the first conductivity type;

doping a third portion of the dopant well with the impurity material of the first conductivity type, the third portion of the dopant well on the second side of the second gate electrode and spaced apart from the sub-portion of the first portion of the dopant well;

forming a fourth electrode to the sub-portion of the second portion of the dopant well and a fifth electrode to the third portion of the dopant well; and forming a sixth electrode to the second gate structure.

9. The method of claim 8, wherein the step of forming a first electrode to the sub-portion of the second portion and a second electrode to the third portion includes forming dielectric spacers along the first and second sides of the first gate structure and the step of forming a fourth electrode to the sub-portion of the second portion of the dopant well and a fifth electrode to the third portion of the dopant well includes forming dielectric spacers along the first and second sides of the second gate structure.

10. The method of claim 8, further including, after the step of doping a sub-portion of the first portion of the dopant well and a second portion of the dopant well, doping the second portion of the dopant well a second time with the impurity material of the second conductivity type, wherein the impurity material from doping the second portion of the dopant well a second time is substantially absent from the sub-portion of the first portion of the dopant well.

11. The method of claim 8, wherein the steps of forming first and second gate structures includes forming a gate oxide on the first portion of the first region of the semiconductor substrate and on the first portion of the dopant well and forming a layer of polysilicon on the gate oxide.

* * * * *